United States Patent
Groeppel et al.

(10) Patent No.: US 8,305,174 B2
(45) Date of Patent: Nov. 6, 2012

(54) SUPERCONDUCTING COIL CAST IN NANOPARTICLE-CONTAINING SEALING COMPOUND

(75) Inventors: Peter Groeppel, Erlangen (DE); Juergen Huber, Erlangen (DE); Lothar Schoen, Neunkirchen (DE); Matthias Uebler, Ursensollen (DE)

(73) Assignee: Siemens Aktiengesellschaft, Munich (DE)

( * ) Notice: Subject to any disclaimer, the term of this patent is extended or adjusted under 35 U.S.C. 154(b) by 170 days.

(21) Appl. No.: 12/763,367

(22) Filed: Apr. 20, 2010

(65) Prior Publication Data

US 2010/0265019 A1  Oct. 21, 2010

(30) Foreign Application Priority Data

Apr. 20, 2009  (DE) .................. 10 2009 018 061

(51) Int. Cl.
*H01H 1/00* (2006.01)

(52) U.S. Cl. ....................................... 335/216; 324/318
(58) Field of Classification Search .................. 335/216, 335/296–299; 324/318
See application file for complete search history.

(56) References Cited

U.S. PATENT DOCUMENTS

| 4,178,677 | A | | 12/1979 | Weisse et al. |
| 5,606,300 | A | * | 2/1997 | Koyama et al. ............... 335/216 |
| 5,872,500 | A | | 2/1999 | Gore |
| 2007/0111893 | A1 | * | 5/2007 | Kodenkandath et al. ...... 505/210 |
| 2008/0197954 | A1 | | 8/2008 | Groeppel et al. |
| 2009/0298987 | A1 | | 12/2009 | Eger et al. |
| 2010/0036035 | A1 | * | 2/2010 | Nelson et al. ................. 524/433 |
| 2011/0115488 | A1 | * | 5/2011 | Groeppel et al. ............. 324/318 |

* cited by examiner

*Primary Examiner* — Bernard Rojas
(74) *Attorney, Agent, or Firm* — Schiff Hardin LLP

(57) ABSTRACT

A superconducting coil for a magnetic resonance apparatus is formed by one or more wound superconducting conductors that are embedded in a cured sealing compound, with a filler composed only of nanoparticles added to the sealing compound.

24 Claims, 1 Drawing Sheet

SUPERCONDUCTING COIL CAST IN NANOPARTICLE-CONTAINING SEALING COMPOUND

BACKGROUND OF THE INVENTION

1. Field of the Invention

The present invention concerns a superconducting coil, in particular for a magnetic resonance apparatus, formed by one or more wound, superconducting coil conductors that are embedded in a cured sealing compound.

2. Description of the Prior Art

In magnetic resonance apparatuses diverse coils are used that—as basic components of such a magnetic resonance apparatus—serve for the generation of magnetic fields. A central coil is a superconducting coil (also frequently called a "magnet coil") that is composed of multiple layers of wound coil conductors made of superconducting material with an essentially rectangular cross section (which is different than, for example, the gradient coil with its wound coil conductors made of copper), wherein the conductors are wound as tightly as possible in order to achieve an optimally high packing density. Such superconducting magnet coils are operated below the critical temperature of the superconducting material; they are cooled to extremely low temperatures before being fed with current. Conventional superconductors are cooled by means of liquid helium—the temperature is 4.2 K; high-temperature superconductors are cooled with liquid nitrogen to a temperature of approximately 77.4 K. The coil conductors themselves are cast in a hardened (cured) sealing compound, typically based on epoxide/amine or epoxide/acid anhydride; they are consequently completely embedded in the sealing compound. For fixing during the winding, a coil carrier is provided on which they are wound. Due to the extreme temperature differences or the extreme cooling and the different coefficients of thermal expansion of the materials involved (coil conductor (superconductor), epoxy resin, coil carrier), there are inevitably large mechanical stresses. These also build during operation, thus when the superconducting coil conductors are fed with current, since Lorentz forces can be produced that by the generated magnetic fields can act on the coil with respect to the coil.

In designing the structure of the coil, great care must be taken and it must be prevented without exception that a coil conductor within a magnet winding can move under an external force effect (for example the mechanical stress upon cooling) or due to Lorentz forces upon being fed with current. A conductor movement inevitably leads to the creation of heat as a result of the transduction of kinetic energy of the moved conductor or its deformation. The arising heat could in the extreme case be sufficient to locally exceed the critical temperature of the superconducting material, causing it to locally become normally-conducting, which would lead inevitably to a quench if the current feed continues.

In order to prevent movement of the conductor, it is thus necessary to embed the coil conductor without error in the sealing compound. This embedding is also frequently called "impregnating". A filler-free, relatively low-viscosity sealing means (impregnating resin), normally based on epoxy resin, is used for this purpose as a result of the very tight conductor winding and the very narrow gaps between the wound individual conductors. However, it is problematical that the tear resistance in such sealing compounds drops with decreasing temperature, meaning that the danger of the occurrence of stress cracks increases in wound superconducting coils specifically in operation when they are thus cooled to the extremely low temperature as cited above (thus typically <80 K).

From DE 10 2007 008 122 A1 an arrangement for cooling a gradient coil is known in which cooling tubes for coolant transport are arranged to dissipate heat from coil layers of the gradient coil. For electrical insulation, insulating plates are arranged both between the coil layers and between the coil layers and the respective cooling hoses. The insulating plates include textile layers (known as "prepregs") that are impregnated with a reaction resin. The resin contains a filler material that has good heat conduction capability. Nanoparticles can also be provided as an additional filler. Remaining interstices at intersection points of the fibers of the textile layers are also filled by the fillers.

WO 2006/027139 A1 describes a polymer composition that contains at least one resin selected from the group consisting of vinyl ester resins, unsaturated polyester resins, acrylates and methacrylates, at least one copolymer with groups reactive to resins and a glass transition temperature $T_g$ of −20° or less, and nanoparticles with an average particle size $d_{max}$ of 5-150 nm (measured by means of small-angle neutron scattering, SANS). The copolymer forms rubber domains in the cured state.

SUMMARY OF THE INVENTION

An object of the invention is to provide a superconducting coil in which the danger of the occurrence of tears or cracks (flaws; faults) in operation is reduced.

To solve this problem, in accordance with the invention a coil of the aforementioned type has nanoparticles added to the sealing compound.

A sealing compound to which a filler is added is used, which is different than has previously occurred in the production of such a superconducting magnet coil. However, according to the invention the filler exists in the form of nanoparticles, thus in the form of particles whose average diameter or average length is normally ≦100 nm. The use of such nanoparticles has the serious advantage that the filler or, respectively, the nanoparticles can also reach into the narrow gap region between two adjacent conductor windings, which gap is normally only a few tenths or hundredths of a millimeter wide. Surprisingly, possible filtration effects in these extremely narrow critical regions that would arise given the use of larger filler particles in the range of tenths of millimeters or the like do not occur as a result of the use of these nanoparticles. Rather, the use of the sealing compound to which nanoparticles have been added according to the invention allows a homogeneous filler distribution in the entire casting volume.

Use of a nanoparticle filler offers the considerable advantage of being able to adjust the physical and mechanical properties of the sealing material via this filler. In particular, an improvement of the tear resistance and a variation of the coefficients of expansion can be achieved via the addition of these filler nanoparticles. It has been shown that very small additions of such nanoparticles to a sealing system (for example one based on epoxy resin) already leads to a serious improvement of the physical and mechanical properties, in particular the tear resistance, the strength and the bonding to wetted boundary surfaces. These property improvements surprisingly appear even at extremely low temperatures as they are present in superconducting coils.

Overall, the application of the sealing compound with nanoparticle filler that is used according to the invention allows a marked improvement of the properties of the coil with regard to their freedom from flaws, even in operation, which is why the aforementioned problem can hereby be particularly advantageously remedied. In spite of the addition of filler, a homogeneous sealing with homogeneous filler distribution in all regions (and therefore identical properties of the sealing compound in all regions) can also be achieved.

As already described, the nanoparticles are extremely small particles. The shape of the nanoparticles can, for example, be spherical, lens-shaped or oblong (shaped like a grain of rice).

The average length or the average diameter should in each case be ≦100 nm, in particular ≦50 nm and advantageously ≦30 nm, consequently in the lower nm range. An average length or an average diameter of approximately 20 nm is preferred.

The nanoparticles that are used can be of only one type, thus be essentially "homogeneous". However, a particle mixture made up of two or more different nanoparticle types is also conceivable, whereby a variation or adjustment of the attained compound parameters can be achieved since the different properties of different particle types (that respectively are formed of different chemical compounds) can be utilized.

The nanoparticles can, for example, be selected from metal oxides $SiO_2$, $Al_2O_3$, $TiO_2$, BN, $Fe_2O_3$, $Fe_3O_4$, ZnO or SiC; however, synthetic ceramics or zeolites can also be used, wherein this enumeration is not exclusive. In principle, all nanoparticle types that meet the requirements of the field of use of the superconducting coil with respect to the extremely low temperatures can be used.

Surprisingly, it has also turned out that small additives of nanoparticle filler already lead to a significant property improvement. The content of nanoparticles should be less than 20% by weight, in particular less than 10% by weight, wherein preferably even smaller proportions in the range of approximately 0.5-5% by weight (±weighing tolerance) are provided. This means that the sealing compound that is used is modified with only a small percentile proportion of nanoparticle filler with respect to the casting resin that is used that forms the matrix. The smaller the filler proportion, the less that in particular the viscosity properties of the obtained fluid casting compound is affected by this, which is advantageous to the extent that the wound conductor structures are frequently relatively complex with respect to the very narrow gaps that are present (as described above), and by sufficiently low sealing compound viscosity it must be ensured that the voids to be sealed are also filled completely without further measures.

In addition to the coil itself, the invention also concerns a sealing compound for electronic modules exposed to low temperatures, in particular a superconducting coil for magnetic resonance apparatuses. This sealing compound is characterized in that it contains only nanoparticles as filler. This means that the filler in the form of nanoparticles is introduced into the sealing compound in a matrix-forming substrate material, for example an epoxy resin or an epoxy anhydride resin.

Due to the possibility of being able to vary the mechanical and physical properties of the matrix-forming substrate material in the cured state via the filler, this sealing compound can be used to cast arbitrary electronic modules that are exposed to thermal loads (thus extreme cold). In particular, such electronic modules that could previously only be cast by filler-free sealing fluids can also be cast due to the negligible quantity of nanoparticles.

The invention also concerns the use of such a sealing compound to produce a superconducting coil of a magnetic resonance apparatus.

DESCRIPTION OF THE PREFERRED EMBODIMENTS

Figure 1:
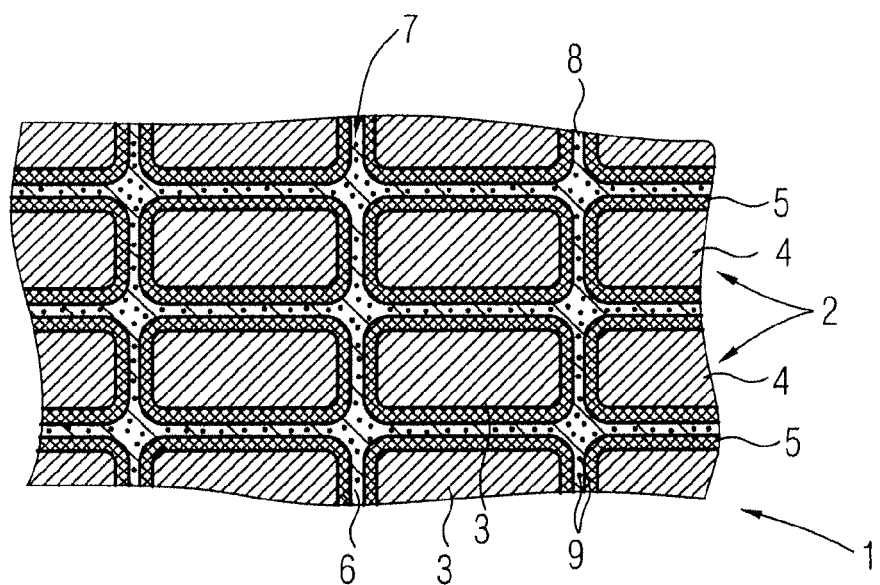
FIG. 1 is a view of a portion of a coil according to the invention, in section.
Figure 2:
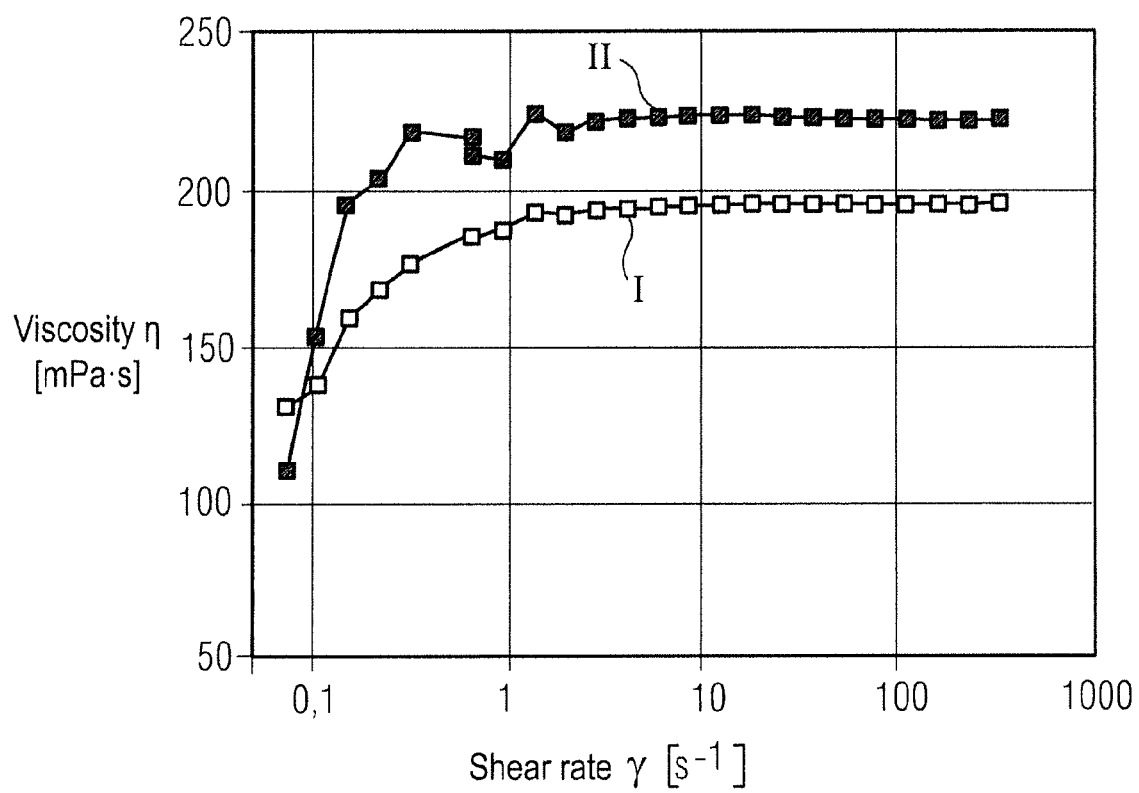
FIG. 2 is a graph showing the viscosity curve of a sealing compound according to the invention in comparison to a filler-free sealing compound.

The shown superconducting coil 1 has a number of individual windings 2 of coil conductors 3 (shown larger than reality for presentation reasons) that have an essentially rectangular cross section in the shown exemplary embodiment. Each coil conductor 3 has a core 4 that contains the superconducting material and an insulation 5 surrounding the core 4, for example made of a resin or thermoplastic layer or a plastic fiber braiding. The individual windings 2 are wound as densely packed as possible; the spacings or interstices 6 shown here between the individual vertical and horizontal conductor layers are shown enlarged for clarity. The gaps are actually markedly smaller; the individual conductors or their insulation 5 are locally in contact.

After winding the individual conductors, it is necessary to cast or impregnate these with a sealing compound 7 so that the conductors 2 are completely embedded in this sealing compound 7. The sealing compound 7 is composed of a matrix-forming substrate material 8 (for example an epoxy resin based on bisphenol A), but naturally other matrix-forming synthetic resins can be also be used that exhibit the desired properties with respect to their extreme requirements during operation. In addition to the matrix-forming substrate material 8, the sealing compound also incorporates nanoparticles 9 embedded in the substrate material 8 and homogeneously distributed therein that are mixed into the fluid sealing compound and likewise are distributed essentially homogeneously in all gaps or interstices 6 between the individual conductor windings or layers. The nanoparticles are represented as dot symbols that naturally do not correspond to the real size of the particles. The nanoparticles are, for example, selected from $SiO_2$, $Al_2O_3$, $TiO_2$, BN, $Fe_2O_3$, $Fe_3O_4$, ZnO, SiC or from synthetic ceramics, zeolites or polymer nanoparticles (this enumeration is not exclusive). The particle size of the introduced nanoparticles should be between 0.5 nm and 100 nm, preferably in the range between 3 nm and 50 nm. The particle shape can ultimately be arbitrary, thus rounded or oblong/rice grain-shaped etc. The nanoparticles can be one particle type, for example only $Al_2O_3$ or $SiO_2$, but can also be arbitrary mixtures of two different types depending on the desired usage purpose or the applicable boundary conditions. The maximum concentration of the admixed nanoparticles should not exceed 20% by weight of the matrix-forming resin proportion; the concentration is preferably ≦5% by weight.

It has been shown that the mechanical properties, in particular the tear resistance, the strength and the adhesion to wetted boundary surfaces, can already be significantly improved by slight addition of the nanoparticles to the epoxy resin system of the sealing compound 6. This property improvement appears particularly in the low-temperature range, thus the temperatures at which superconducting coils are operated. The fluidity of the sealing compound is not negatively affected by the low effective content of nanoparticles (and consequently the homogeneous distribution and small size), meaning that the distribution of the resin adjusts in the same manner as before and consequently the impregnation behavior of the sealing compound does not change. As a result of their minimal size, the nanoparticles are advantageously not filtered out in regions of narrow gaps between superconducting layers; rather, it is possible that they, together with the substrate material, can penetrate even into extremely narrow gaps and can substantially homogeneously become distributed at such locations, so that the properties of the sealing compound are identical at nearly all points in the cured state. A complete impregnation of an insulating, fine-meshed plastic weave of the conductor 2 is also achievable without additional measures.

The following table shows different property characteristic values of a typical sealing compound composed of the pure, matrix-forming substrate material and a sealing compound according to the invention consisting of the matrix-forming substrate material containing 5% by weight nanoparticles. The matrix-forming substrate material was a modified epoxy resin based on bisphenol A; a modified anhydride hardener based on methyl hexahydrophthalic acid anhydride was used as a hardener, and a tertiary amine was used as an accelerator. In the sealing compound according to the invention, spherical $SiO_2$ nanoparticles with an average diameter of 20 nm were added with a proportion of 5% by weight.

curing ensued at 80° C. for 8 hours; a curing at 140° C. for 10 hours ensued in the subsequent second stage.

The respective measured characteristic material values are in the left column. The second column indicates the respective sample geometry. The determined characteristic mold material values for the respective sample composed of matrix-forming substrate material are indicated in the third column (0% additive) while the respective characteristic material values for samples produced with the sealing compound according to the invention (5% addition of nanoparticles) are shown in the right column.

It can clearly be seen that nearly all determined characteristic solid material values could be improved given the use of the sealing compound according to the invention. In comparison to the previously used sealing compound, the coefficient of longitudinal thermal expansion decreases while the glass transition temperature increases. Significant variations also appear in the modulus of elasticity; the flexural strength could likewise be improved as well as the impact toughness. The mechanical dissipation factor decreases, as well as the modulus of loss, while the storage modulus increases. The central mechanical parameters—such as the modulus of elasticity in extension, tensile strength, critical stress intensity factor and critical energy at break—likewise show markedly improved values.

| Characteristic molding material value: | Sample geometry: | 0% (pure resin): | 5% by weight (nanoparticle): |
|---|---|---|---|
| Coefficient of longitudinal thermal expansion $\alpha$ [ppm] (ISO 11359-2) | 3 × 3 × 4 mm | 63.4 | 62.6 |
| Glass transition $T_G$ [° C.] (ISO 11359-2) | 3 × 3 × 4 mm | 108.5 | 111.9 |
| Modulus of elasticity [MPa] 0.5 mm/min 5.0 mm/min (DIN EN ISO 178) | 10 × 15 × 125 mm | 2438 ± 96 2269 ± 70 | 2632 ± 90 2535 ± 126 |
| Flexural strength [MPa] 0.5 mm/min 5.0 mm/min (DIN EN ISO 178) | 10 × 15 × 125 mm | 123.6 ± 1.1 132.2 ± 0.5 | 125.7 ± 1.3 132.4 ± 1.5 |
| Impact toughness [$kJ/m^2$] (DIN EN ISO 179) | 10 × 15 × 125 mm | 18.9 ± 4.9 | 20.1 ± 5.3 |
| Mechanical dissipation factor $\tan \delta_{mech}$ [—] (DIN 65583) | 10 × 15 × 125 mm | 1.07 | 1.01 |
| Storage modulus E' [MPa] (DIN 65583) | 10 × 15 × 125 mm | 2141 | 2502 |
| Modulus of loss E'' [MPa] (DIN 65583) | 10 × 15 × 125 mm | 61 | 36 |
| Modulus of elasticity in extension [MPa] (DIN EN ISO 527-2) | 10 × 15 × 125 mm | 3064 ± 120 | 3311 ± 76 |
| Tensile strength [MPa] (DIN EN ISO 527-2) | 10 × 15 × 125 mm | 72.2 ± 0.7 | 74.1 ± 0.9 |
| Critical stress intensity factor $K_{1C}$ [$MPa\sqrt{m}$] (based on ASTM E 399) | 80 × 40 × 4 mm central V-notch 60° | 0.46 ± 0.07 | 0.64 ± 0.04 |
| Critical energy at break $G_{1C}$ [$J/m^2$] (based on ASTM E 399) | 80 × 40 × 4 mm central V-notch 60° | 84.5 ± 16 | 141.3 ± 18.8 |

The respective measurement methods according to ISO or DIN or ASTM are specified with regard to the respective measured characteristic molding material values.

Respective rectangular sample bodies with the respective specified sample geometry have been produced that were cured in a two-stage curing procedure. In the first stage the An examination of the flow behavior has ultimately yielded that a sufficiently good viscosity behavior is present in spite of the addition of nanoparticles. The course of the flow curves of the previously used pure sealing compound (flow curve I) and of the sealing compound with added nanoparticles according to the invention (flow curve II) as they have also been used to produce the aforementioned sample bodies is shown in FIG.

2. The shear rate is shown in $s^{-1}$ along the abscissa; the viscosity is shown in mPa·s along the ordinate. The preparation temperature was 50° C., the shear rate range 0.07-500 $s^{-1}$. A maximum viscosity increase of 14% as a result of the particle addition could be established in a range between 1-500 $s^{-1}$, meaning that a good viscosity corresponding to the requirements is still present in spite of the particle addition. The curve course shows no thixotropy effects at all over the entire shear rate range.

Although modifications and changes may be suggested by those skilled in the art, it is the intention of the inventors to embody within the patent warranted hereon all changes and modifications as reasonably and properly come within the scope of their contribution to the art.

We claim as our invention:

1. A superconducting coil assembly comprising: at least one superconducting coil conductor wound to form a superconducting coil configuration;
   a cured sealing compound in which said at least one superconducting coil conductor, wound in said superconducting coil configuration, is embedded, said sealing compound comprising Sealing compound substrate material exhibiting a critical stress intensity factor $K_{IC}$ and a critical energy at break $G_{IC}$; and
   said cured sealing compound substrate material comprising a filler consisting exclusively of nanoparticles increase $K_{IC}$ and $G_{IC}$.

2. A superconducting coil assembly as claimed in claim 1 wherein said nanoparticles have an average dimension, selected from the group consisting of average length and average diameter, of less than or equal 100 nm.

3. A superconducting coil assembly as claimed in claim 1 wherein said nanoparticles have an average dimension, selected from the group consisting of average length and average diameter, of less than or equal 50 nm.

4. A superconducting coil assembly as claimed in claim 1 wherein said nanoparticles have an average dimension, selected from the group consisting of average length and average diameter, of less than or equal 30 nm.

5. A superconducting coil assembly as claimed in claim 1 wherein said nanoparticles comprise a single type of nanoparticles.

6. A superconducting coil assembly as claimed in claim 1 wherein said nanoparticles comprise multiple different types of nanoparticles.

7. A superconducting coil assembly as claimed in claim 1 wherein said nanoparticles are comprised of material selected from the group consisting of $SiO_2$, $Al_2O_3$, $TiO_2$, BN, $Fe_2O_3$, $Fe_3O_4$, ZnO, SiC, synthetic ceramics, zeolites and polymer nanoparticles.

8. A superconducting coil assembly as claimed in claim 1 wherein said superconducting coil configuration comprises a diameter, length and winding density to form a basic field magnet of a magnetic resonance tomography apparatus.

9. A superconducting coil assembly as claimed in claim 1 wherein said nanoparticles are substantially uniformly distributed in said sealing compound.

10. A superconducting coil assembly as claimed in claim 1 wherein said nanoparticles comprise less than 20% by weight of said cured sealing compound.

11. A superconducting coil assembly as claimed in claim 1 wherein said nanoparticles comprise less than 10% by weight of said cured sealing compound.

12. A superconducting coil assembly as claimed in claim 1 wherein said nanoparticles comprise less than 0.5-5% by weight of said cured sealing compound.

13. A sealing compound for an electronic component exposed to low temperatures, comprising:
    sealing compound substrate material selected from the group consisting of epoxy resin and epoxy anhydride resin, said sealing compound substrate material exhibiting a critical stress intensity factor $K_{IC}$ and a critical energy at break $G_{IC}$, and
    filler in said substrate material consisting exclusively of nanoparticles that increases $K_{IC}$ and $G_{IC}$.

14. A sealing compound as claimed in claim 13 wherein said nanoparticles have an average dimension, selected from the group consisting of average length and average diameter, of less than or equal 100 nm.

15. A sealing compound as claimed in claim 13 wherein said nanoparticles have an average dimension, selected from the group consisting of average length and average diameter, of less than or equal 50 nm.

16. A sealing compound as claimed in claim 13 wherein said nanoparticles have an average dimension, selected from the group consisting of average length and average diameter, of less than or equal 30 nm.

17. A sealing compound as claimed in claim 13 wherein said nanoparticles comprise a single type of nanoparticles.

18. A sealing compound as claimed in claim 13 wherein said nanoparticles comprise multiple different types of nanoparticles.

19. A sealing compound as claimed in claim 13 wherein said nanoparticles are comprised of material selected from the group consisting of $SiO_2$, $Al_2O_3$, $TiO_2$, BN, $Fe_2O_3$, $Fe_3O_4$, ZnO, SiC, synthetic ceramics, zeolites and polymer nanoparticles.

20. A sealing compound as claimed in claim 13 wherein said nanoparticles are substantially uniformly distributed in said sealing compound substrate material.

21. A sealing compound as claimed in claim 13 wherein said nanoparticles comprise less than 20% by weight of said sealing compound substrate material.

22. A sealing compound as claimed in claim 13 wherein said nanoparticles comprise less than 10% by weight of said cured sealing compound substrate material.

23. A sealing compound as claimed in claim 13 wherein said nanoparticles comprise less than 0.5-5% by weight of said cured sealing compound substrate material.

24. A method for manufacturing a basic field magnet for a magnetic resonance tomography apparatus, comprising the steps of:
    winding a superconducting coil into a superconducting coil configuration having a diameter, length and winding density to generate a static, basic magnetic field in a magnetic resonance tomography apparatus;
    adding a filler consisting exclusively of nanoparticles to sealing compound substrate material, said sealing compound substrate material exhibiting a critical stress intensity factor $K_{IC}$ and a critical energy at break $G_{IC}$, I and, by said adding of said filler, increasing $K_{IC}$ and $G_{IC}$ of said sealing compound substrate material; and
    casting said superconducting coil in said superconducting coil configuration in said nanoparticles containing fluid sealing compound, and curing said nanoparticles-containing fluid sealing compound to form a hardened structure in which said superconducting coil, in said superconducting coil configuration, and said nanoparticles are embedded.

* * * * *